(12) United States Patent  
Dixit

(10) Patent No.: US 7,782,107 B2
(45) Date of Patent: Aug. 24, 2010

(54) METHOD AND APPARATUS FOR AN EVENT TOLERANT STORAGE CIRCUIT

(75) Inventor: Anand Dixit, Mountain View, CA (US)

(73) Assignee: Oracle America, Inc., Redwood City, CA (US)

( * ) Notice: Subject to any disclaimer, the term of this patent is extended or adjusted under 35 U.S.C. 154(b) by 0 days.

(21) Appl. No.: 12/165,578

(22) Filed: Jun. 30, 2008

(65) Prior Publication Data

US 2009/0322401 A1    Dec. 31, 2009

(51) Int. Cl.
*H03K 3/356*    (2006.01)

(52) U.S. Cl. .................. 327/208; 327/34; 327/199; 365/189.05

(58) Field of Classification Search ........... 327/185, 327/199, 202, 203, 205, 214, 215, 218, 535, 327/538, 34; 365/189.05
See application file for complete search history.

(56) References Cited

U.S. PATENT DOCUMENTS

| 6,366,132 | B1 * | 4/2002 | Karnik et al. ............... 326/121 |
| 7,193,451 | B2 * | 3/2007 | Hendrickson ............... 327/199 |
| 2002/0130693 | A1 * | 9/2002 | Kojima et al. ............... 327/211 |
| 2006/0015786 | A1 * | 1/2006 | Mitra et al. ................. 714/724 |
| 2006/0164143 | A1 * | 7/2006 | Hendrickson ............... 327/199 |
| 2009/0164834 | A1 * | 6/2009 | Tang ............................ 714/2 |

* cited by examiner

*Primary Examiner*—Lincoln Donovan
*Assistant Examiner*—Shikha Goyal
(74) *Attorney, Agent, or Firm*—Gregory P. Durbin; Polsinelli Shughart PC

(57) ABSTRACT

An apparatus for an event tolerant circuit including a latch. The event tolerant circuit may maintain correct data values even after the occurrence of an event such as a soft error. The event tolerant circuit may introduce a delay in a feedback loop, thereby passing the glitch value to an element in the feedback loop at different times, thus preventing the propagation of the glitch through the event tolerant circuit.

18 Claims, 5 Drawing Sheets

METHOD AND APPARATUS FOR AN EVENT TOLERANT STORAGE CIRCUIT

FIELD OF THE INVENTION

The present invention generally relates to latches and more specifically to an event (soft error) tolerant circuit, such as latches and flip-flops.

BACKGROUND

Generally, soft errors involve changes to data, rather than changes to a physical circuit, where the data is unintentionally altered due to the presence of spurious changes in a circuit. A soft error, unlike many other errors, may be recoverable by rewriting the data or by other means. Soft errors may occur on transmission lines, in digital logic, in analog circuits, semiconductor storage elements and elsewhere.

Often times, soft errors are caused by neutrons from cosmic rays and alpha particles emitted from integrated circuit packaging material (soft error sources), although other causes are also possible. A neutron may undergo neutron capture by a nucleus of an atom, producing an unstable isotope that in turn decays producing a charged particle. A neutron may also collide with a lattice ion knocking it off. Both scenarios may lead to a charged particle traveling through the lattice. Radioactive decay of semiconductor packaging may also result in the emission of an alpha particle. These charged particles may deposit a trail of electron-hole pairs as they slow down. This deposited charge may then unpredictably alter a data state.

A latch or flip flop, both being storage elements, are fundamental building blocks of modern day processors, memory circuits, etc. Generally speaking, a latch or flip flop involves a circuit that stores a data value (e.g., a logic one or logic zero). In the case of alpha particles, where such a particle hits a transistor device in a storage element, a charge may be transferred to a sensitive node of the device that alters a data value stored in the device (the soft error). Clearly, an unintended data value alteration may result in improper operation of a circuit, processor, etc., employing the storage element. For example, a soft error may alter the program code stored in the memory of a microprocessor resulting in improper microprocessor operation. Such an error may be referred to as a soft error because the affected program code may be rewritten to restore proper microprocessor operation.

Accordingly, there is a need in the art for a storage circuit that does not alter a stored data value when alpha particles, neutrons, and other spurious changes, intrude on portions of the storage circuit. As will be recognized from the discussion below, these and other problems in the art are addressed by various systems and methods conforming to aspects of the present invention. Before explaining the disclosed embodiments in detail, it is to be understood that the invention is not limited in its application to the details of the particular arrangements shown, because the invention is capable of other embodiments. Moreover, aspects of the invention may be set forth in different combinations and arrangements to define inventions unique in their own right. Also, the terminology used herein is for the purpose of description and not of limitation.

SUMMARY

Generally, one aspect of the present disclosure involves an event tolerant circuit. The event tolerant circuit may comprise an input coupled with a storage node that substantially maintains a storage voltage level and a feedback loop coupled with the storage node. The feedback loop may be configured to reinforce a first voltage level at the storage node. Further, the feedback loop may include a logic gate having at least one input and at least one output. The at least one output may be in communication with the storage node, where the logic gate may be configured to pass a first voltage level at the at least one input to the at least one output. The first voltage level may be passed when the first voltage level at the at least one input to the logic gate substantially maintains the first voltage level for at least a delay time T which may reinforce the storage voltage level of the storage node. Additionally, the logic gate may be configured to not pass the first voltage level from the at least one input to the at least one output when the first voltage level at the at least one input to the logic gate does not substantially maintain the first voltage level for at least the delay time T to prevent a glitch from altering the storage voltage level at the storage node.

Another aspect of the present disclosure may include the event tolerant circuit where the circuit may be a d-latch and the logic gate may be a C-element. Further, the event tolerant circuit may include a delay element that may be coupled to an input of the at least one input of the C-element. The delay element may introduce a delay time T to provide the first voltage level at non-overlapping times to the C-element, the first voltage level being from the glitch. Additionally, the event tolerant circuit may include a feedback loop which may be comprised of at least a first inverter coupled to the storage node, where the first inverter may be positioned to invert the storage voltage level of the storage node and a second inverter that may be coupled to the output of the logic gate, where the second inverter may invert the output voltage level of the first inverter when the second inverter is on. The event tolerant circuit may also include at least a transmission gate that may be positioned between the input and the storage node, where the transmission gate may be configured to pass a voltage level to the storage node when the transmission gate is on. The event tolerant circuit may also include a clock line that may allow the storage voltage level to pass through the transmission gate when the clock line has a low value and also may substantially prevent the storage voltage level to pass through the transmission gate when the clock line has a high value. The event tolerant circuit may also include a clock line that may regulate the second inverter in communication with the output of the logic gate, wherein the second inverter is on when the clock line has a low value. The event tolerant circuit may also include a capacitor that may be coupled to the storage node, wherein the capacitor may achieve a substantially similar voltage level in relation to an input voltage level received at the input, where the input voltage level may be relative to a data value.

In yet another embodiment of the present disclosure, a method may prevent a glitch from altering a storage voltage level at a storage node. The method may include storing a first data value at a storage node, where the first data value may have a voltage level. The method may also include passing a second data value to the storage node, wherein the second data value may have been previously passed through a feedback loop and suppressing a glitch in the feedback loop. Suppressing the glitch in the feedback loop may further include dividing a path of the glitch in the feedback loop into at least two glitch paths, delaying the glitch on at least one of the glitch paths, passing the delayed glitch to a logic gate, where the logic gate may receive at least the glitch and the delayed glitch at different points in time, thereby causing the logic gate to eliminate the glitch from the feedback loop. Additionally, the first data value and the second data value may be substantially similar voltage levels. The method may further include passing the glitch to at least a first input and a second input of a logic gate, where the first input and the second input of the logic gate may receive the glitch at non-overlapping times and the duration of the glitch delay may be based at least on a maximum duration of the glitch. The duration of the delay may also be greater than the maximum duration of the of the glitch. The method may also include comparing at least a first input data value at the first input of the logic gate to at least a second input data value at the second input of the logic gate, wherein the second input of the logic gate may be the delayed glitch, and passing a previously held data value to the output of the logic gate when the first input data value is different then the second data input value. Moreover, the method may include passing an inverted data value to the output of the logic gate when the first input data value is substantially similar to the second input data value.

In still another embodiment of the present disclosure, a method for suppressing a glitch in a feedback loop may include passing a glitch on a first glitch path to a first input of a logic gate. The method may further include delaying the glitch on a second glitch path, and passing the delayed glitch on the second glitch path to a second input of the logic gate. The method may also include receiving the glitch at the first input of the logic gate and receiving the delayed glitch at the second input of the logic gate at a time differential. The time differential is at least a time difference between receipt of the glitch at the first input and the receipt of the delayed glitch at the second input, where the time difference may be at least longer than a duration of the glitch. The method may also include outputting a previously held data value after comparing the data values at the second input and the first input, wherein the data values at the first input and the second input are different.

These and other advantages and features of the present invention will become apparent to those of ordinary skill in the art upon reading this disclosure in its entirety.

DETAILED DESCRIPTION OF EMBODIMENTS

One aspect of the present invention involves a latch or flip flop employing a gated C-element where the latch may recover from individual events, whether alpha particle, neutron hits, or the like, where the state of the latch is not altered by the event. For example, if the latch holds a data value of zero, an alpha particle may not cause the data value to change to one. As used herein, the term "latch" and "flip flop" are used interchangeably to refer to a storage element that stores a data value (e.g., a logic zero or logic one).

It should be noted that embodiments of the present invention may be used in a variety of electrical circuits including any type of electrical system. The embodiment may include a variety of electrical components, input lines and output lines. Aspects of the present invention may be used with practically any apparatus related to circuits or electrical components or an apparatus that may contain any type of circuit. Accordingly, embodiments of the present invention may be employed in circuits, integrated circuits and/or electrical systems that include electrical components or peripherals and so on.

Figure 1:
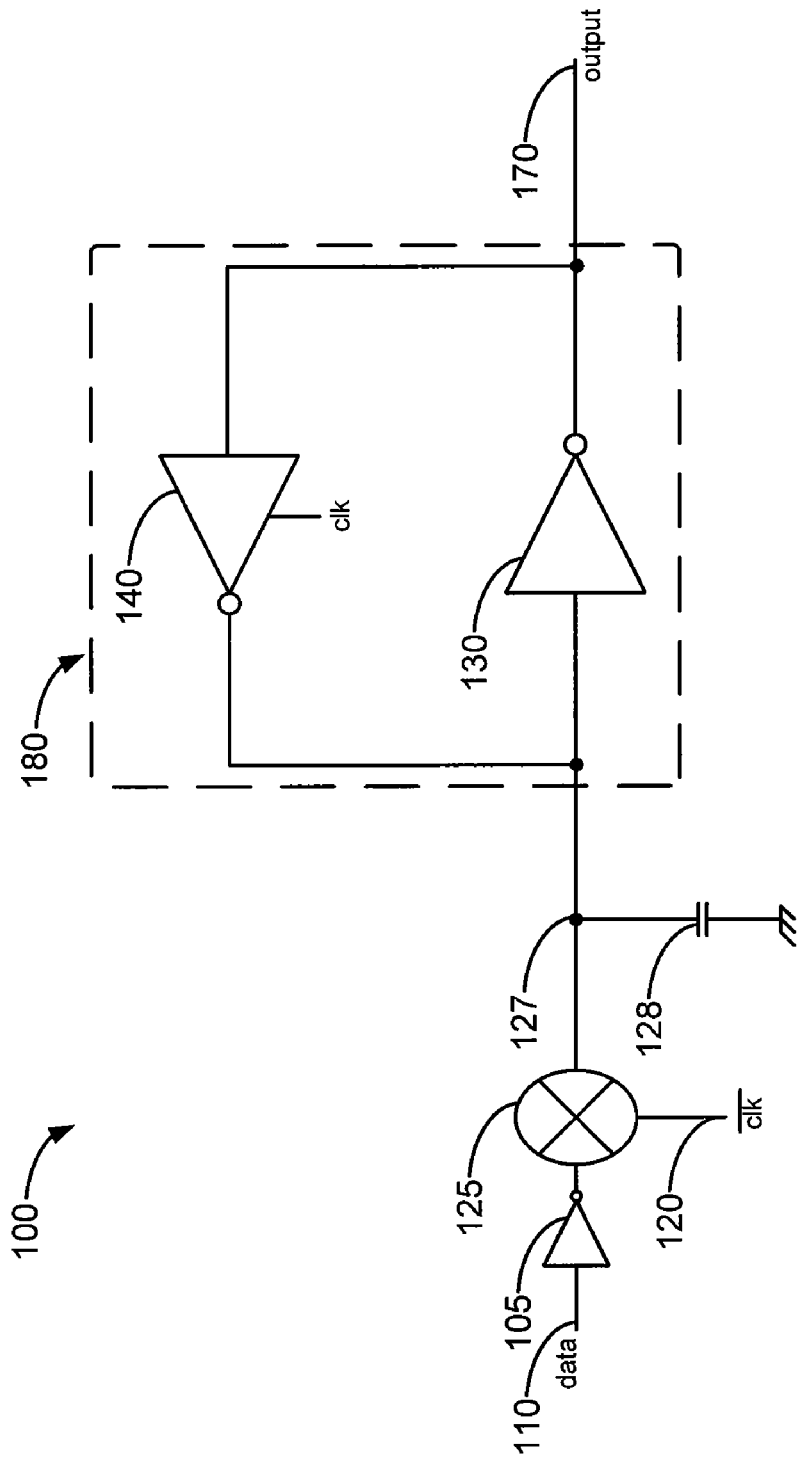
FIG. 1 depicts one embodiment of a functional schematic of a traditional latch.
Figure 2:
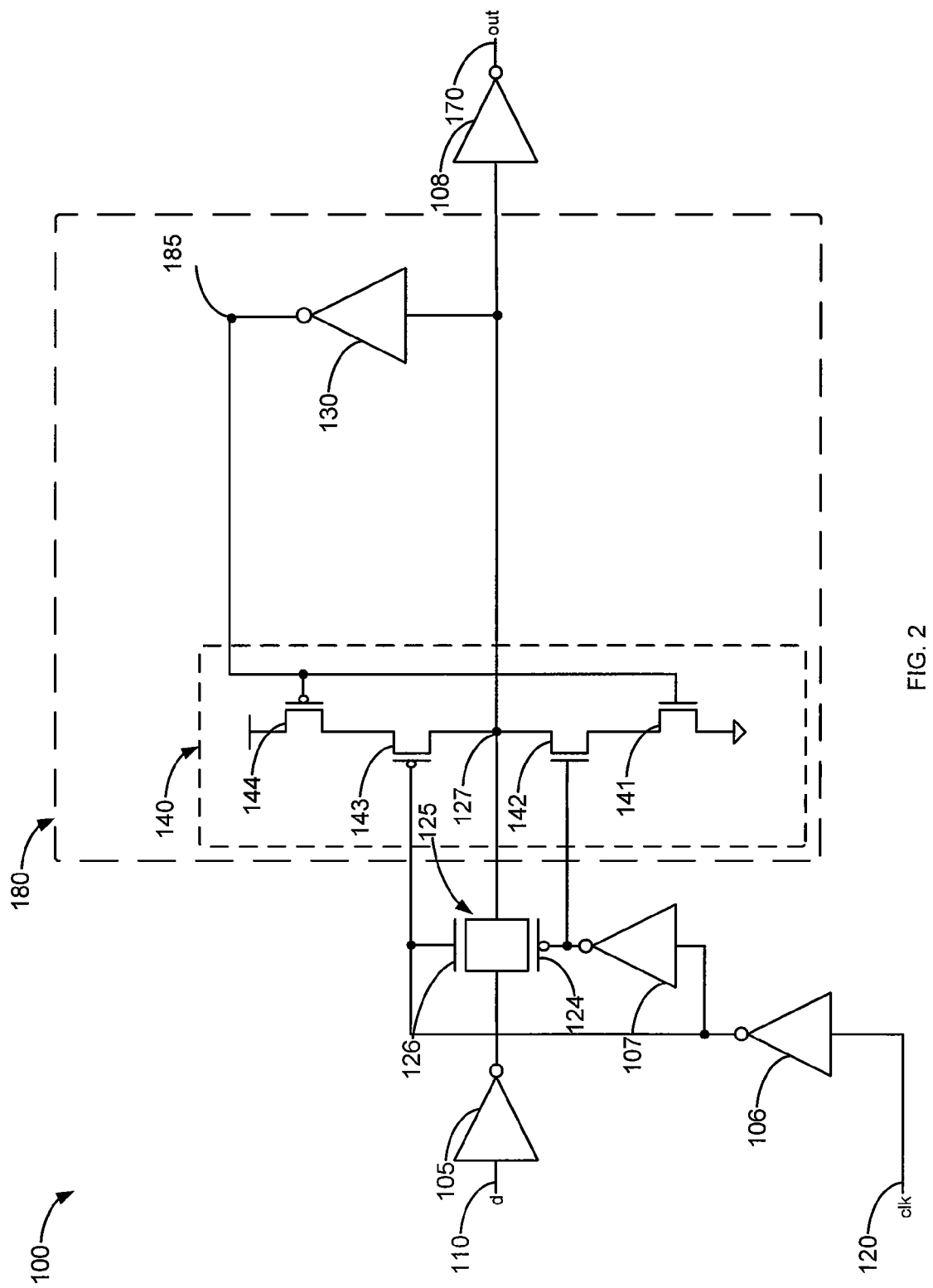
FIG. 2 depicts another embodiment of a traditional latch.

FIGS. 1 and 2 are diagrams illustrating a functional logic diagram and a schematic diagram. Additionally, in FIG. 1 and FIG. 2, the latch 100 is a non-inverting latch. The latch 100 includes a data input line 110, which receives data values, coupled to an inverter 105, a data output line 170 which passes data values out of the latch and a clock line 120.

Similarly, the data input line 110 may be a voltage of zero or substantially zero (a low state) and also may be a voltage of Vdd or approximately Vdd (a high state). The values of the clock line may be a voltage of zero or substantially zero (e.g., a low state) and also may be a voltage of Vdd or approximately Vdd (e.g., a high state). As used herein, "Vdd" is a reference voltage. Different embodiments may employ different voltages for the voltage Vdd. Thus, generally, the clock line 120, the data input line 110 and the data output line 170 may be at zero, at Vdd or transitioning between zero and Vdd. In the following discussion, the clock line 120, the data input line 110 and the data output line 170 may be referred to as having a zero voltage and a voltage of Vdd for the purposes of explanation and not of limitation.

As mentioned above, a latch typically maintains one of two possible states, a high state or a low state. In one embodiment, the latch will store a value from the data line (or the latch may be "on") while the clock line is high. The latch will be transparent or "off" while the value of the clock line is low. A non-inverting latch may input and output approximately the same data value. For example, with respect to the non-inverting latch of FIG. 1 and FIG. 2, the input data value of the data input line 110 may be high and stored in the latch at one clock event, then the output data value of the data output line 170 will also be high and copied to the output data line as appropriate following the clock event. In another embodiment, the single event tolerant latch 100 may not include the inverter 105 and thus may be an inverting latch which may receive data values at an input and then may output the inverse of the data values. For example, FIG. 1 or FIG. 2 may be inverting latches by excluding inverter 105 from the circuit, thus the data value of the data input line 110 may be high and the data value of the data output line 170 may be low.

FIG. 2 is a similar and more detailed representation of the single event tolerant latch 100 of FIG. 1. FIG. 2 includes similar elements as the latch 100 of FIG. 1 and also includes additional signal buffers and/or inverters. In FIG. 2, the clock line 120 includes an inverter 106 (first clock buffer), an inverter 107 (second clock buffer) on the clock line 120 and an inverter 108 (output buffer) on the data output line 170. The buffering inverters 106, 107, 108 on the clock line 120 and the data output line 170, respectively, may insure the clock signal and the output data signal have the appropriate drive strength. Additionally, the buffering inverters, inverter 106, inverter 107 and inverter 108 may be optionally included in the latch 100 represented in FIG. 2.

As shown in FIG. 1 and FIG. 2, the data input line 110 may be operationally or directly connected to a clocked transmission gate 125. Generally speaking, the clocked transmission gate 125 passes a signal from the data input line of the clocked transmission gate 125 to the data output line of the clocked transmission gate 125 at a low clock signal. The clocked transmission gate 125 is connected to the clock line 120. Hence, the transmission gate copies the data value from the input line to the storage node on a low clock signal. The data output line of the clocked transmission gate 125 is connected to the storage node 127.

FIG. 2 illustrates one particular implementation of the clocked transmission gate 125 introduced in FIG. 1. In this example, the clocked transmission gate 125 receives two complimentary clock inputs. The clock signal of clock line 120 is inverted at inverter 106. An inverted clock signal may be referred to herein as "clock bar". The clock bar signal also passes through inverter 107, inverting the clock bar signal to the original clock signal. Accordingly, a first input into the clocked transmission gate 125 may be clock bar and a second input into the clocked transmission gate 125 may be clock.

As depicted in FIG. 2, the clocked transmission gate 125 may be comprised of two switches such as a first transistor 126 and a second transistor 124, where the first and the second transistor may be operationally or directly connected in parallel with one another. The first transistor 126 may be an N metal-oxide-semiconductor ("NMOS") transistor and the second transistor 124 may be a P metal-oxide-semiconductor ("PMOS") transistor or vice versa. For example, as in FIG. 2, clock bar may be the input for the gate of the NMOS transistor 126 of the clocked transmission gate 125 and clock may be the input for the gate of the PMOS transistor 124 of the clocked transmission gate 125.

The clocked transmission gate 125 allows current to flow from the input to the output of the clocked transmission gate 125 or a signal may pass through the clocked transmission gate 125 (the clocked transmission gate 125 may be "on") when the NMOS transistor and the PMOS transistor both allow a connection between the input and the output, respectively, or the two transistors are both "on." The NMOS transistor may be on when the gate of the NMOS transistor receives a high input and the PMOS transistor may be on when the gate of the PMOS transistor receives a low input. Thus, in FIG. 2, the clocked transmission gate 125 may be on when the NMOS transistor gate receives a high input (clock bar is high) and while the PMOS transistor gate receives a low input (clock is low).

Furthermore, the clocked transmission gate 125 may be off or prevent current from flowing when the NMOS transistor and the PMOS transistor are both off or both of the transistors are preventing a connection between the input and the output, respectively. In FIG. 2, the clocked transmission gate 125 may be off when the NMOS transistor gate receives a low input (clock bar is low) and the PMOS transistor gate receives a high input (clock is high). In other embodiments, it is also possible for the NMOS transistor to be connected to clock and the PMOS transistor to be connected to clock bar.

As shown in FIG. 1, the storage node 127 may be connected to the capacitor 128 and the output of the clocked transmission gate 125. The capacitor 128 may charge to the inverted value initially reflected on the data input line 110 when the clocked transmission gate 125 is on. For example, as in FIG. 2, the clocked transmission gate 125 may be on and may reflect a high value. Continuing the example, current flows from the output of the clocked transmission gate 125 to the storage node 127 and may also charge capacitor 128 to a high state. In another example, if the data input line 110 reflects a high value and the clocked transmission gate 125 is on, the capacitor 128 will be at a low state. Hence, the data value of the latch, whether high or low, is presented at the storage node 127 and the capacitor 128. Additionally, in FIGS. 2 and 3, capacitance may be provided by the devices attached to node 127.

The storage node 127 is operationally connected in a feedback loop 180 that ensures that the capacitor 128 maintains the same or a substantially similar charge for a period of time that the latch needs to store its data value (e.g., one clock cycle).

The feedback loop 180 is configured to provide a high state or a low state to the storage node 127, with the high or low state being the same data value stored at the storage node 127. Thus, if the storage node 127 is changed to Vdd by the clocked transmission gate 125 (a logic one) the feed back loop 180 also outputs Vdd to the storage node 127. The feed back loop 180 then maintains the charge at the storage node 127 when the clocked transmission gate 125 is off. Without the feedback loop 180, the storage node 127 can discharge due to leakage or the like and then erroneously change its state.

As shown in FIG. 1, the feedback loop 180 includes a first inverter 130 and a second inverter 140. A data signal passes from storage node 127 to first inverter 130. An inverted data signal may exit first inverter 130 and pass to the data output line 170 and also to the input of second inverter 140. Second inverter 140 may also be operationally or directly connected to the clock line 120 and may be triggered by the clock line. In one example, the second inverter 140 may be on when the clock line is high and may pass a data value to storage node 127 and operationally to capacitor 128, thus charging capacitor 128 to the same or a substantially similar data value stored at the capacitor 128, to maintain the data state stored at the capacitor 128. The data value may be a voltage level representing a logic high state or a logic low state.

The clock bar signal may be high and the clocked transmission gate 125 may be on and may allow a data value to pass to the storage node 127. When clock bar is high, the clock signal is accordingly low and second inverter 140 may be off. In the case where second inverter 140 is off when the clock line is low, a data value may not be operationally or directly passed from the output of second inverter 140 to the storage node 127. In the case where the clock signal is low, a data value may not be passed from the output of the second inverter 140 to the storage node 127 because the clocked transmission gate 125 may be on. The clocked transmission gate 125 may pass one of two approximate values to the storage node 127 when the clock signal is low or the clocked transmission gate 125 is on. In this case, the clocked transmission gate 125 may pass a data value to storage node 127 that is the same (or substantially similar) to the previous value that the clocked transmission gate 125 passed to the storage node 127 or the clocked transmission gate 125 may pass a different value than the previous value that was passed to the storage node 127.

In one embodiment, the clock signal may be low and the transmission gate 125 may be on. In this example, the clocked transmission gate 125 may pass a value to the storage node 127 that is a different value than the value currently stored in storage node 127. In this case, the second inverter 140 may be off. The second inverter 140 may be off so that the previous value will not be passed to the storage node 127 and overwrite the current data value that is being passed to the storage node 127 by the clocked transmission gate 125. For example, the storage node 127 may be storing a value of one. While the clocked transmission gate 125 is off (the clock is high), the second inverter 140 may be on, thus passing a value of one to the storage node 127. The clock may switch to a value of zero and turn on the clocked transmission gate 125. The clocked transmission gate 125 may then pass a value of zero to the storage node 127. The second inverter 140 may be off so that it may not pass the previous value of one to the storage node 127 and overwrite the current value of zero that is being passed by the clocked transmission gate 125.

In another embodiment, in FIGS. 1 and 2, the second inverter 140 may be not connected to a clock line and thus may not be triggered by the clock line. In this embodiment, the transmission gate 125 and the inverter 105 may be sized to overpower any contention from inverter 140 when the transmission gate 125 is on.

FIG. 2 provides an example of one particular way to implement the feedback loop 180. In FIG. 2, the second inverter 140 includes a first and second NMOS transistor 141, 142 and a first and second PMOS transistor 143, 144. In this example, the second inverter 140 is on when the clock is high, thus the second inverter 140 copies the inverted data value at the input to the output. The NMOS transistor 142 and the PMOS transistor 143 may be on as the gate of NMOS transistor 142 receives a high clock signal (clock is high) and the gate of PMOS transistor 143 receives a low clock signal (clock bar is low). If the data value at node 185 is high, PMOS transistor 144 may be off and NMOS transistor 141 may be on and invert the data value to a low data value. However, if the data value at node 185 is low, NMOS transistor 141 may be off and PMOS transistor 144 may turn on and invert the data value to a high data value.

Figure 3:
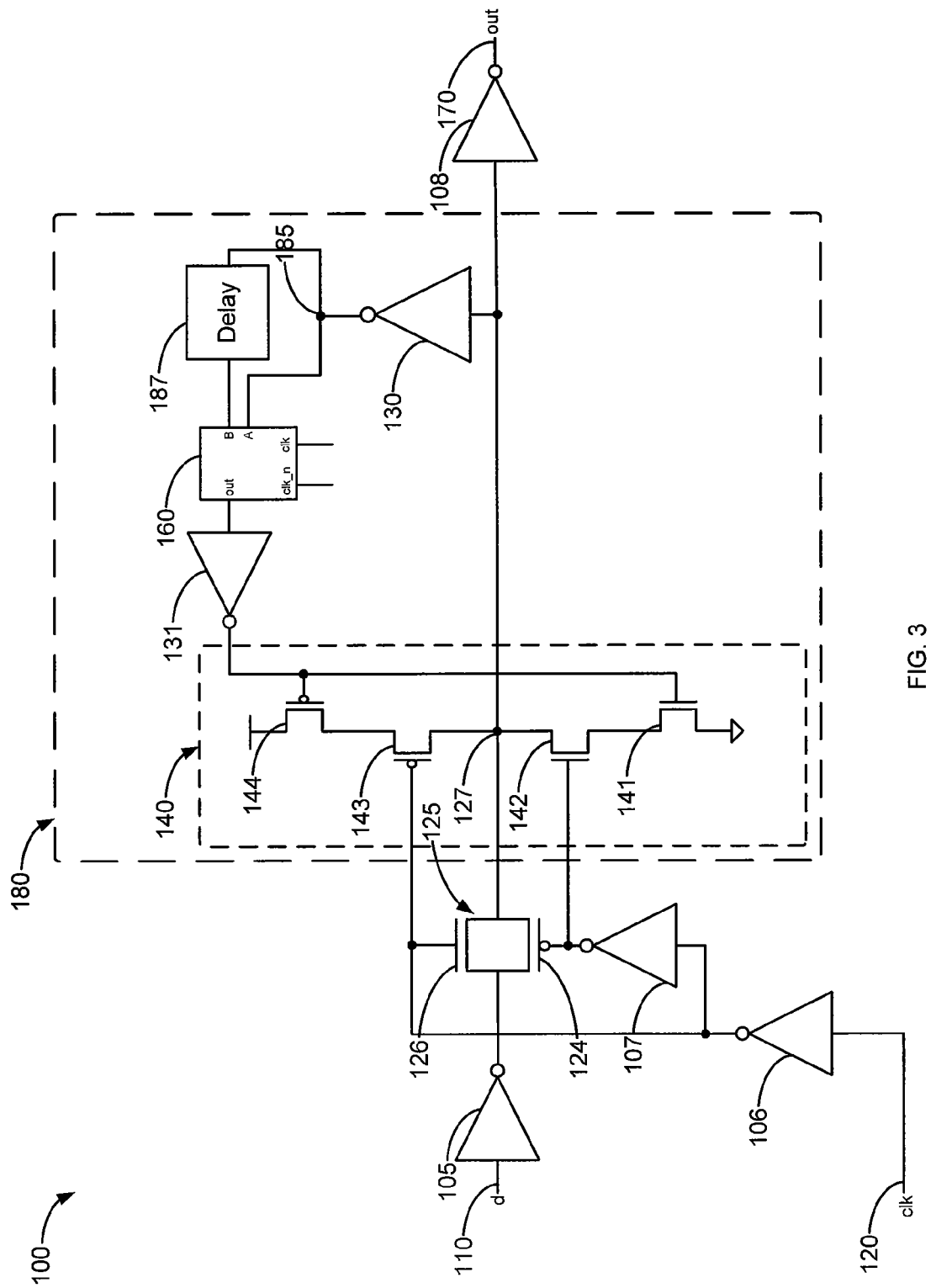
FIG. 3 depicts one embodiment of a single event tolerant latch.

Our discussion now turns to the functionality of the gated C-element 160, and how it may prevent the propagation of an event (such as a spurious change induced by an alpha particle or the like) through the feedback loop 180, which if unhindered could erroneously alter the state of the storage node 127. FIG. 3 is an example of a latch including similar elements as FIG. 2, with additional illustration of the components of the gated C-element 160.

Figures 4A, 4B:
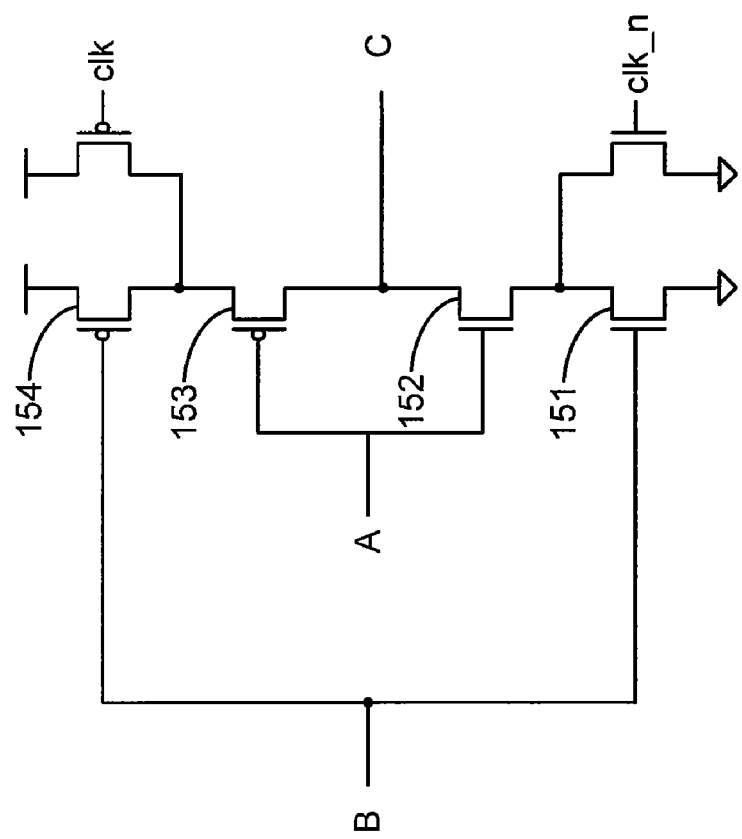
FIG. 4 depicts a schematic of a gated C-element and includes a truth table for a C-element.

Generally, a C-element is a state holding logic element that may have two or more inputs and an output. FIG. 4A illustrates one possible implementation of a C-element and FIG. 4B illustrates a truth table for the C-element of FIG. 4A. As reflected in the two input C-element truth table of FIG. 4B, the value of an output of a C-element may be an inverted value of the input states when the states of the inputs agree, otherwise the output value may hold the value of the previous output. Thus, a C-element will not transition to the opposite state unless all the inputs are the same state. That is, as reflected in the truth table of FIG. 4B, when all inputs are a logic zero, the output is a logic one and when all inputs are a logic one, the output is a logic zero. The output will not transition from a logic one to a logic zero (or from a logic zero to a logic one) until both the inputs are at a logic zero state (or at a logic one state respectively).

The C-element of FIG. 4A has two inputs, A and B, and an output C. Additionally, the C-element in FIG. 4A has a clock input connected to the drain of PMOS transistor 154 and the source of PMOS transistor 153 and a clock bar input connected to the source of NMOS transistor 152 and the drain of NMOS transistor 151. The C-element in FIG. 4A has two PMOS transistors, 153, 154, with a drain of PMOS transistor 154 connected to a source of PMOS transistor 153. The C-element also has two NMOS transistors, 151, 152, with a source of NMOS transistor 152 connected to a drain of NMOS transistor 151. Input A is connected to the gates of PMOS transistor 153 and NMOS transistor 152. Input B is connected to the gates of PMOS transistor 154 and NMOS transistor 151. A number of different configurations are possible using various types of electrical switching elements. The particular configuration provided in FIG. 4A is for explanatory purposes only and not of limitation.

In one example, when input A is high and input B is low, NMOS transistor 152 and PMOS transistor 154 are conducting, while PMOS transistor 153 and NMOS transistor 151 are off. Similarly, continuing the example, when input A is low and input B is high, PMOS transistor 153 and NMOS transistor 151 are conducting, while PMOS transistor 154 and NMOS transistor 152 are off. Thus, when the inputs of the C-element differ in value the conduction path between the supply, Vdd, and the output and the conduction path between the ground, GND, and the output are broken. Additionally, when inputs A and B are both low, NMOS transistors 151, 152 are off and PMOS transistors 153, 154 are conducting. Similarly, when inputs A and B are both high, NMOS transistors 151 and 152 are both conducting and PMOS transistors 153, 154 are off.

As shown in FIG. 4A, a clock input may be connected to the drain of PMOS transistor 154 and the source of PMOS transistor 153 and a clock bar input connected to the source of NMOS transistor 152 and the drain of NMOS transistor 151. Additionally, when the clock is low, a high value is passed to the drain of PMOS transistor 154 and the source of PMOS transistor 153 and when clock bar is high, a low value is passed to the source of NMOS transistor 152 and the drain of NMOS transistor 151. In one embodiment, the C-element may behave as an inverter for input A when the clock is low and may behave as a C-element when the clock is high.

In FIG. 3 (similar to FIG. 1 and FIG. 2), gated C-element 160 is preceded by a delay element 187. The delay element 187 may delay a value from the input of the delay element 187 to the output of the delay element 187. In one example, the soft error event may be a neutron that affects the circuit. The neutron may produce a charged particle, where the charged particle affects the crystal structure of the storage element by propagating through the silicon lattice structure. As the charged particle propagates through the lattice, electron-hole pairs may be created and the additional electrons and/or holes may be collected by the junctions in the respective transistors. The additional charge collected by a transistor may be enough to alter the state of the stored data.

In one embodiment, the soft error may cause the output of the transmission gate 125 in FIG. 3 to switch values. The transient value may be passed to the feedback loop 180. The transient value may propagate through the first inverter 130 and the erroneous inverted value may be passed to the node 185. The node 185 may operationally or directly pass the first inverter 130 output value to the input of the delay element 187 and also to the C-element input A. As shown in FIG. 3, the delay element 187 output may be operationally or directly connected to the C-element input B. The erroneous transient value may take longer to pass to the C-element input B due to passing through the delay element 187. The duration of the transient value may be a shorter period of time than the delay from the delay element 187. In the case where the lifetime of the transient value is shorter than the delay from the delay element 187, then node 185 may recover to the original output value of the transmission gate 125 before the transient value may pass through the delay element 187 and then to input B of the C-element. Accordingly, input A and input B of the C-element may receive the transient values at non-overlapping times and the C-element may prevent the propagation of the transient value back to the storage node 127.

Generally, a latch may have a setup time and a hold time. The setup time may be the minimum amount of time that a data value may be stable before a clock transition and the hold time may be the minimum amount of time that a data value may be stable after a clock transition. Additionally, the data value may be constant between the setup time and the hold time. Referring to FIG. 2, the feedback loop 180 may affect the setup time and the hold time due to, at least a delay introduced by the inverter 130. The feedback loop 180 of FIG. 3 includes first inverter 130 and second inverter 131. Both of first inverter 130 and second inverter 131 may be removed from the feedback loop 180 to shorten the impact of the additional circuit elements on the setup/hold time of the latch.

Further, the output inverter 108 may also be excluded from the single event tolerant latch 100 of FIG. 3, thus making the latch an inverting latch.

Referring to FIG. 3, the feedback loop 180 may affect the setup time and the hold time due to, at least a delay introduced by the first and second inverters 130, 131, the C-element 160 and the delay element 187. In one embodiment, the feedback loop 180 of FIG. 3 may exclude the first and second inverters 130 and 131 and include the C-element 160 and the delay element 187. Continuing the description of this embodiment, the C-element 160 and the delay element 187 combined, may introduce a delay that may be approximately the same delay as introduced by the inverter 130 of FIG. 2. The C-element 160 may be clocked (as shown in FIG. 3), thus when the clock is low, the C-element 160 may function as an inverter for input A. Accordingly, the delay element 187 may not introduce a delay when the clock is low for the C-element 160. When the clock is low, the C-element 160 may function as an inverter for input A and input B may not affect the function of the C-element 160, thus excluding the delay from the feedback loop 180.

Figure 5:
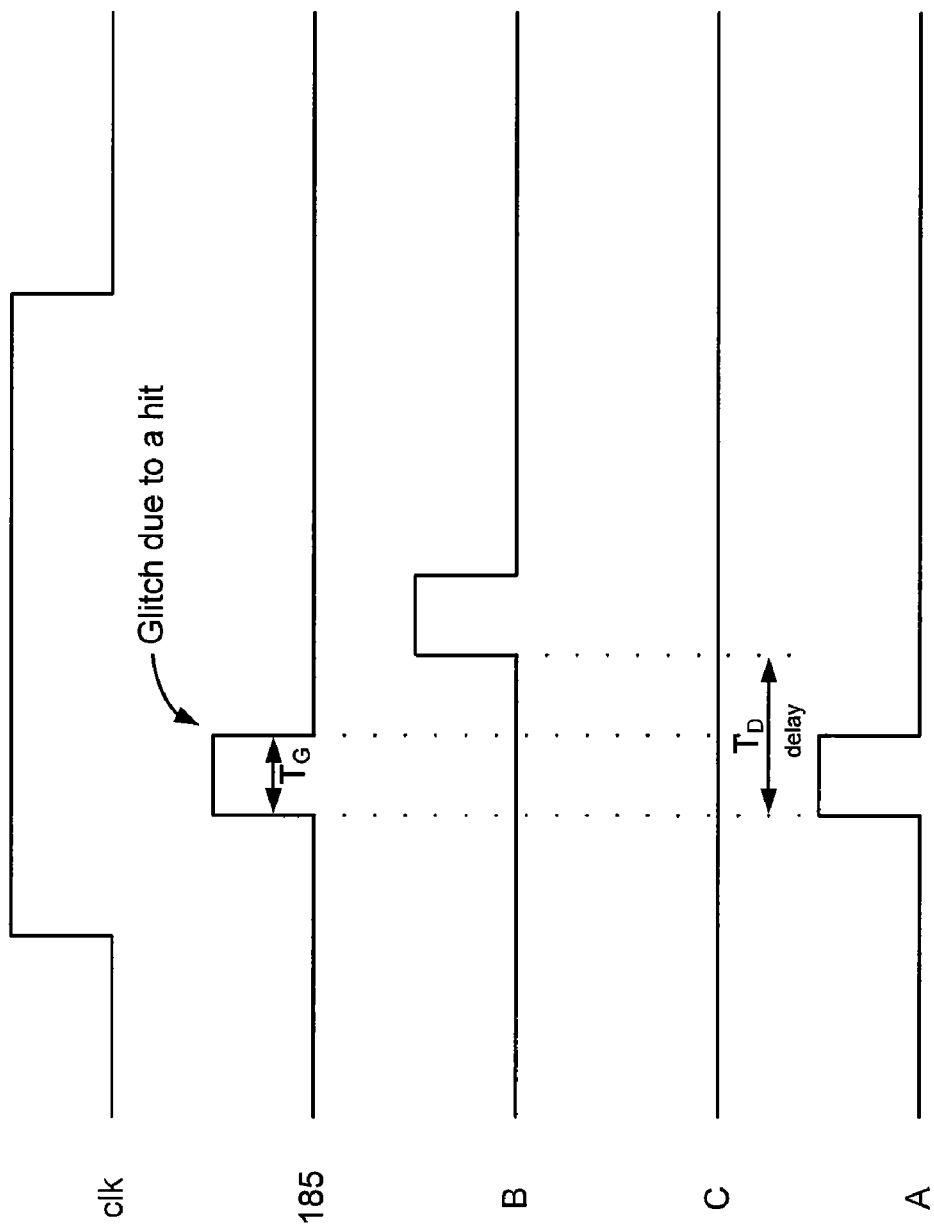
FIG. 5 depicts an embodiment of a timing diagram of how a C-element may absorb a glitch.

FIG. 5 is a timing diagram depicting one representation of the interaction between the timing of a single event (such as a soft error) and one possible way the gated C-element may mitigate the effect of a soft error on a storage element. FIG. 5 indicates that the delay element may have a duration that is longer than the lifetime of the glitch due to the soft error. The duration of the delay element may differ depending on the amount of protection that a circuit may need and because the time duration of a glitch may vary. The duration of the delay element may be determined in a number of ways. For example, the duration of the delay may be determined by the expected maximum lifetime of the glitch. Additionally, it is possible to determine a theoretical limit on the charge deposited per unit length (typically referred to as Linear Energy Transfer or LET) in the lattice structure. The determined limit may be proportional to the atomic number of the ion involved and thus, may yield a theoretical maximum duration for the glitch based on at least the silicon thickness and the chemical composition of the materials. The chemical composition of the materials may include, but is not limited to, silicon, dopants, metals, oxides, the package and so on. As previously discussed, this may result in the inputs of the C-element receiving the transient value at non-overlapping time intervals, thus preventing the propagation of the erroneous transient values to the storage node 127.

For example, a soft error may cause a glitch (spurious value) that may be passed from storage node 127 to node 185. The glitch may then be received at input A of the gated C-element 160 and at the input of the delay element 187. As illustrated in FIG. 5, the glitch from node 185 may be passed to the gated C-element 160 at input A as shown on line A. Also shown in FIG. 5, the glitch may be passed to input B of gated C-element 160 after the glitch first passes through delay element 187. The delay element 187 may delay the glitch for a period denoted "delay" in FIG. 5. The delay period of delay element 187 may be a period of time $T_D$ that is greater than the duration of the glitch $T_G$, thus the glitch may not be received by the gated C-element 160 concurrently on input line A and input line B. The glitch may be received on input line A and input line B by the gated C-element 160 at non-overlapping times, thus the glitch may not be propagated through the gated C-element 160 to the output C. Accordingly, FIG. 5 illustrates on line C that the gated C-element 160 does not pass the glitch to the outputs C.

Although the present invention has been described with respect to particular apparatuses, configurations, components, systems and methods of operation, it will be appreciated by those of ordinary skill in the art upon reading this disclosure that certain changes or modifications to the embodiments and/or their operations, as described herein, may be made without departing from the spirit or scope of the invention. Accordingly, the proper scope of the invention is defined by the appended claims. The various embodiments, operations, components and configurations disclosed herein are generally exemplary rather than limiting in scope.

The invention claimed is:

1. An event tolerant circuit comprising:
   an input coupled with a storage node that maintains a storage voltage level;
   a feedback loop coupled with the storage node, the feedback loop configured to reinforce a first voltage level at the storage node; and
   the feedback loop including a C-element having at least one input and at least one output, the feedback loop further including a delay element connected with the at least one input, the at least one output in communication with the storage node, the C-element configured to pass a first voltage level from the at least one input to the at least one output when the first voltage level at the at least one input to the C-element maintains the first voltage level for at least a delay time T, provided by the delay element, to reinforce the storage voltage level of the storage node, and to not pass the first voltage level from the at least one input to the at least one output when the first voltage level at the at least one input to the C-element does not maintain the first voltage level for at least the delay time T to prevent a glitch from altering the storage voltage level at the storage node,
   wherein the delay element is configured to sample the storage voltage of the storage node.

2. The event tolerant circuit of claim 1 wherein the circuit comprises a d-latch.

3. The event tolerant circuit of claim 1, wherein the delay element is directly coupled to an input of the at least one input of the C-element.

4. The event tolerant circuit of claim 3 wherein the delay element introduces the delay time T to provide the first voltage level at non-overlapping times to the C-element, the first voltage level being from the glitch.

5. The event tolerant circuit of claim 3 wherein the feedback loop further comprises:
   a first inverter having an input and an output, the input of the first inverter being coupled to the storage node so as to invert the storage voltage level of the storage node; and
   a second inverter coupled to the output of the C-element, the second inverter configured to invert the output voltage level of the first inverter;
   wherein the delay element and the C-element are both connected with the output of the first inverter.

6. The event tolerant circuit of claim 1 further comprising a transmission gate positioned between the input and the storage node, the transmission gate configured to pass a voltage level to the storage node.

7. The event tolerant circuit of claim 6 further comprising a clock line coupled to the transmission gate, wherein the transmission gate passes the storage voltage when the clock line has a low value and substantially prevents the storage voltage level to pass through the transmission gate when the clock line has a high value.

8. The event tolerant circuit of claim 5 further comprising a clock line configured to regulate the second inverter in communication with the output of the C-element.

9. The event tolerant circuit of claim 1 further comprising a capacitor coupled to the storage node, wherein the capacitor is configured to receive and maintain the storage voltage level.

10. A method for preventing a glitch from altering a storage voltage level at a storage node comprising:
- storing a first data value at a storage node, the first data value having a voltage level;
- passing a second data value to the storage node, wherein the second data value is previously passed through a feedback loop including a logic gate having a first input and a first output and a delay element connected with the input of the logic gate; and
- suppressing a glitch in the feedback loop, wherein suppressing the glitch in the feedback loop further comprises:
  - dividing a path of the glitch in the feedback loop into a first glitch path and a second glitch path;
  - passing the glitch through the delay element to delay the glitch on at least one of the glitch paths; and
  - passing the delayed glitch to the logic gate, wherein the logic gate receives a first glitch from the first glitch path and a second glitch from the second glitch path at different points in time, thereby causing the logic gate to eliminate the glitch from the feedback loop.

11. The method of claim 1 wherein the first data value and the second data value are substantially similar voltage levels.

12. The method of claim 10 wherein passing the delayed glitch includes, passing the first glitch to the first input of the logic gate and passing the second glitch to a second input of the logic gate at non-overlapping times.

13. The method of claim 10 wherein the duration of the glitch delay is based at least on a maximum duration of the glitch.

14. The method of claim 10 wherein the duration of the delay is greater than the maximum duration of the of the glitch.

15. The method of claim 10 further comprising comparing at least a first input data value at the first input of the logic gate to at least a second input data value at the second input of the logic gate, wherein the second input of the logic gate is the delayed glitch, and passing a previously held data value to the output of the logic gate when the first input data value is different then the second data input value.

16. The method of claim 15 further comprising passing an inverted data value to the output of the logic gate when the first input data value is substantially similar to the second input data value.

17. The method of claim 10 further comprising introducing a delay value into the circuit, the delay value determined by a gated C-element and the delay element, wherein the delay value does not affect a setup time and a hold time when the clock is low, further wherein the gated C-element excludes the delay value when the clock is low.

18. The method of claim 10 wherein suppressing the glitch in the feedback loop further comprises absorbing the glitch before the first time preceding the clock edge and absorbing the glitch after the second time following the clock edge.

* * * * *